(12) United States Patent
Sun et al.

(10) Patent No.: US 12,019,340 B2
(45) Date of Patent: Jun. 25, 2024

(54) DISPLAY PANEL AND DISPLAY

(71) Applicant: HKC CORPORATION LIMITED, Shenzhen (CN)

(72) Inventors: Xiaowu Sun, Shenzhen (CN); Yanna Yang, Shenzhen (CN); Haoxuan Zheng, Shenzhen (CN)

(73) Assignee: HKC CORPORATION LIMITED, Shenzhen (CN)

(*) Notice: Subject to any disclaimer, the term of this patent is extended or adjusted under 35 U.S.C. 154(b) by 0 days.

(21) Appl. No.: 18/061,646

(22) Filed: Dec. 5, 2022

(65) Prior Publication Data

US 2023/0194934 A1 Jun. 22, 2023

(30) Foreign Application Priority Data

Dec. 17, 2021 (CN) .......................... 202111558559.2

(51) Int. Cl.
*H01L 27/12* (2006.01)
*G02F 1/1343* (2006.01)
(Continued)

(52) U.S. Cl.
CPC .. *G02F 1/134372* (2021.01); *G02F 1/134363* (2013.01); *G09G 3/2096* (2013.01);
(Continued)

(58) Field of Classification Search
CPC ........ G02F 1/134372; G02F 1/134363; G02F 1/133742; G02F 1/1396; G09G 3/2096;
(Continued)

(56) References Cited

U.S. PATENT DOCUMENTS

| 5,220,315 A | 6/1993 | Clerc | |
| 10,788,918 B2* | 9/2020 | Kim | .................. G06F 3/0412 |
| 2007/0273678 A1* | 11/2007 | Okita | .................. G09G 3/3648 |
| | | | 345/204 |

(Continued)

FOREIGN PATENT DOCUMENTS

| CN | 101510402 A | 8/2009 |
| CN | 103578439 A | 2/2014 |

(Continued)

OTHER PUBLICATIONS

First Office Action issued in counterpart Chinese Patent Application No. 202111558559.2, dated Jul. 1, 2022.
(Continued)

*Primary Examiner* — Douglas M Wilson
(74) *Attorney, Agent, or Firm* — Westbridge IP LLC

(57) ABSTRACT

Disclosed are a display panel and a display. The display panel includes a pixel array and a compensation unit, and the pixel array is connected with a plurality of common electrode wires, the compensation unit includes a detection terminal and a feedback terminal; the one or more common electrode wires are provided with a first connecting wire, and the one or more electrode wires are provided with a second connecting wire, the first connecting wire is connected with the test terminal and the second connecting wire is connected with the feedback terminal, both the first connecting wire and the second connecting wire are provided with a configuration section; when the configuration section is provided with the connector, a connecting wire corresponding to the configuration section is in an on-state; when the configuration section is provided without a connector, a connecting wire corresponding to the configuration section is in an off-state.

14 Claims, 8 Drawing Sheets

(51) Int. Cl.
*G09G 3/20* (2006.01)
*G09G 3/34* (2006.01)
*G02F 1/1337* (2006.01)
*G02F 1/139* (2006.01)
*G09G 3/36* (2006.01)

(52) U.S. Cl.
CPC ......... *G09G 3/3406* (2013.01); *H01L 27/124* (2013.01); *G02F 1/133742* (2021.01); *G02F 1/1396* (2013.01); *G09G 3/36* (2013.01); *G09G 3/3655* (2013.01); *G09G 3/3696* (2013.01); *G09G 2300/0426* (2013.01); *G09G 2300/0819* (2013.01); *G09G 2320/02* (2013.01); *G09G 2320/0209* (2013.01); *G09G 2320/0223* (2013.01); *G09G 2330/021* (2013.01)

(58) Field of Classification Search
CPC ......... G09G 3/3406; G09G 2300/0426; G09G 2330/021; G09G 2320/0209; G09G 2320/0223; G09G 3/36; G09G 2320/02; G09G 2320/0233; G09G 2320/0242; G09G 3/3655; G09G 3/3696; G09G 2300/0819; H01L 27/124
See application file for complete search history.

(56) References Cited

U.S. PATENT DOCUMENTS

2015/0062471 A1\* 3/2015 Sung .................... G02F 1/1362
349/33
2018/0040286 A1\* 2/2018 Huang ................ G09G 3/3611

FOREIGN PATENT DOCUMENTS

| CN | 104269147 A | | 1/2015 | |
| --- | --- | --- | --- | --- |
| CN | 205139542 U | | 4/2016 | |
| CN | 206004998 U | | 3/2017 | |
| CN | 106652934 A | | 5/2017 | |
| CN | 107678216 A | | 2/2018 | |
| CN | 109031831 A | \* | 12/2018 | ......... G02F 1/13338 |
| CN | 109545134 A | | 3/2019 | |
| CN | 109920383 A | | 6/2019 | |
| CN | 111123079 A | | 5/2020 | |
| CN | 111736400 A | | 10/2020 | |
| CN | 112738992 A | | 4/2021 | |
| JP | 2009162983 A | | 7/2009 | |

OTHER PUBLICATIONS

Second Office Action issued in counterpart Chinese Patent Application No. 202111558559.2, dated Sep. 5, 2022.

\* cited by examiner

DISPLAY PANEL AND DISPLAY

CROSS-REFERENCE TO RELATED APPLICATIONS

This application claims priority to Chinese Patent Application No. 202111558559.2, filed on Dec. 17, 2021, the entire contents of which are incorporated herein by reference.

TECHNICAL FIELD

The present disclosure relates to the technical field of liquid crystal display, and in particular to a display panel and a display.

BACKGROUND

In a liquid crystal display panel, two poles of an applied electric filed of liquid crystal are a pixel electrode and a common electrode respectively, a parasitic capacitance exists between a data line and the common electrode, and a voltage variation of the data line can cause an instantaneous voltage jump on the common electrode through a parasitic capacitance, which changes the applied electric filed of liquid crystal, therefore a pixel brightness will be changed, causing a horizontal crosstalk, and the horizontal crosstalk will worsen in a special screen in which the voltage jump of the common electrode cannot be offset, thus a display effect and a user experience will be severely affected.

Nowadays, an inverse compensation is set in the common electrode, when detecting the voltage jump of the common electrode, an inverse voltage feedback is sent to the common electrode to ensure that the voltage of the common electrode quickly returns to a preset value, thus the horizontal crosstalk is substantially reduced. A choice of a position and quantity of a detection point and a feedback point of the inverse compensation in the common electrode will affect a compensation effect. Therefore, the inverse compensation in the common electrode usually needs a debugging in an actual product, if a chosen compensation method fails to achieve the expected compensation effect, the display panel needs to be rewired, resulting in slow debugging progress and increased cost.

SUMMARY

The main objective of the present disclosure is to provide a display panel and a display. A configurable connecting wire is provided for each common electrode, the debugging personnel is able to flexibly configure each connecting wire to form an inverse compensation circuit which needs to be tested on a basis of a needed circuit, which solves the problem that in the related art, in order to debug the inverse compensation of the common electrode when the chosen compensation method fails to achieve the expected compensation effect, the display panel needs to be rewired, resulting in low efficiency and high cost.

To achieve the above objective, the present disclosure provides a display panel, the display panel includes a pixel array connected with a plurality of common electrode wires, and a compensation unit including a detection terminal for accessing a voltage of the common electrode wire, and a feedback terminal for feeding back a compensation voltage to the common electrode wire; and at least one common electrode wire is provided with a first connecting wire and a second connecting wire, the first connecting wire is connected with the detection terminal, the second connecting wire is connected with the feedback terminal, both the first connecting wire and the second connecting wire are provided with a configuration section; and when the configuration section is provided with a connector, a connecting wire corresponding to the configuration section is in an on-state, or when the configuration section is provided without a connector, a connecting wire corresponding to the configuration section is in an off-state.

In an embodiment, each common electrode wire is provided with the first connecting wire and the second connecting wire.

In an embodiment, the plurality of common electrode wires include a plurality of first common electrode wires and a plurality of second common electrode wires, and the first common electrode wire is provided on a color filter substrate of the display panel, at least one first common electrode wire is provided with the second connecting wire, and at least one second common electrode wire is provided with the second connecting wire.

In an embodiment, the display panel further includes a power supply unit, the power supply unit is provided with a power supply terminal, and the power supply unit supplies a fixed voltage to the power supply terminal;

the second connecting wire corresponding to the first common electrode wire is connected with the power supply terminal, the second connecting wire corresponding to the second common electrode wire is connected with the feedback terminal; or the second connecting wire corresponding to the first common electrode wire is connected with the feedback terminal, the second connecting wire corresponding to the second common electrode wire is connected with the power supply terminal.

In an embodiment, the feedback terminal includes a first feedback terminal and a second feedback terminal, the second connecting wire corresponding to the first common electrode wire is connected with the first feedback terminal, and the second connecting wire corresponding to the second common electrode wire is connected with the second feedback terminal.

In an embodiment, a configuration section of at least one first connecting wire is provided with the connector, and a configuration section of at least one second connecting wire is provided with the connector.

In an embodiment, the plurality of common electrode wires include a plurality of first common electrode wires and a plurality of second common electrode wires, the first common electrode wire is provided on the array substrate of the display panel, the second common electrode wire is provided on the color filter substrate of the display panel, and at least one first common electrode wire is provided with a second connecting wire in an on-state, at least one second common electrode wire is provided with a second connecting wire in an on-state.

In an embodiment, at least one first common electrode wire is provided with a first connecting wire in an on-state, and at least one second common electrode wire is provided with a first connecting wire in an on-state.

In an embodiment, each common electrode wire is provided with a connecting wire in an on-state.

To achieve the above objective, the present disclosure further provides a display, the display includes a backlight module and the above display panel, the backlight module is provided on a back of the display panel, the backlight module is used for supplying a backlight for the display panel.

In the present disclosure, the display panel includes a pixel array and a compensation unit, and the pixel array is connected with a plurality of common electrode wires, the compensation unit includes a detection terminal and a feedback terminal. The one or more common electrode wires are provided with a first connecting wire, and the one or more electrode wires are provided with a second connecting wire. The first connecting wire is connected with the test terminal and the second connecting wire is connected with the feedback terminal. Both the first connecting wire and the second connecting wire are provided with a configuration section. When the configuration section is provided with the connector, a connecting wire corresponding to the configuration section is in an on-state. When the configuration section is provided without a connector, a connecting wire corresponding to the configuration section is in an off-state. In the present disclosure, when debugging an inverse compensation of the common electrode, the debugging personnel may configure the configuration sections on each connecting wire, and adjust the position and quantity of the detection point and the position and quantity of the feedback point. Thus, when the debugging personnel readjusts a wiring, a rewiring is not needed, which improves the debugging efficiency and reduces the cost.

BRIEF DESCRIPTION OF THE DRAWINGS

In order to more clearly illustrate the technical solutions in the embodiments of the present disclosure or in the related art, drawings used in the embodiments or in the related art will be briefly described below. Obviously, the drawings in the following description are only some embodiments of the present disclosure. It will be apparent to those skilled in the art that other figures can be obtained according to the structures shown in the drawings without creative work.

Figure 1:
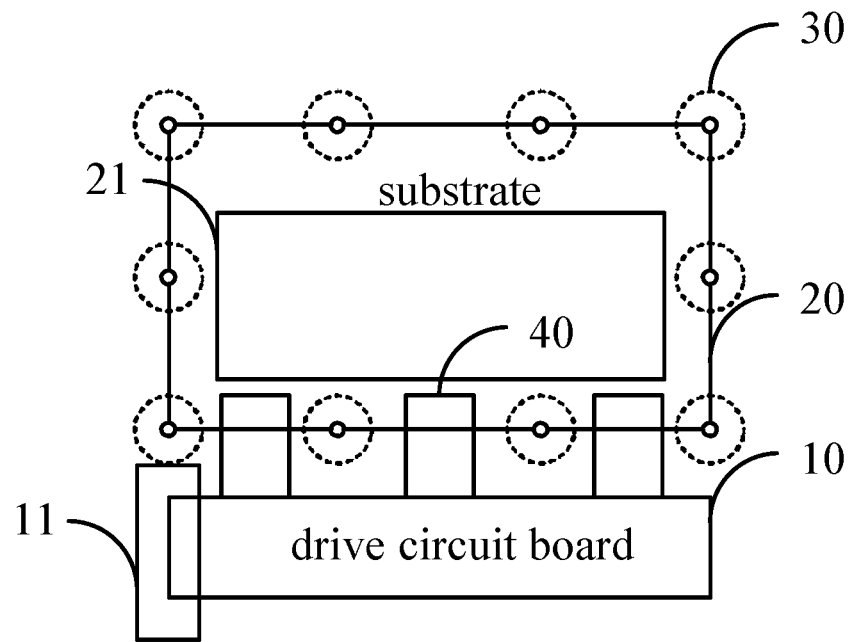
FIG. 1 is a schematic structural diagram of a display panel driven in a Fringe Field Switching (FFS)/In-Plane Switching (IPS) mode of the present disclosure.

The realization of the objective, functional characteristics, and advantages of the present disclosure are further described with reference to the accompanying drawings.

DETAILED DESCRIPTION OF THE EMBODIMENTS

It should be understood that the specific embodiments described herein are only used to explain the present disclosure, and are not intended to limit the present disclosure.

The technical solutions in the embodiments of the present disclosure will be clearly and completely described below with reference to the drawings in the embodiment of the present disclosure. Obviously, the described embodiments are only a part of the embodiments of the present disclosure, not all of the embodiments. Based on the embodiments in the present disclosure, all other embodiments perceived by those ordinary skills in the art without creative effort should be fallen within the protection scope of the present disclosure.

It should be noted that all of the directional instructions in the embodiments of the present disclosure (such as, up, down, left, right, front, rear) are only used to explain the relative position relationship and movement of each component under a specific attitude (as shown in the drawings), if the specific attitude changes, the directional instructions will change correspondingly.

Besides, the descriptions in the present disclosure that refer to "first," "second," etc. are only for descriptive purposes and are not to be interpreted as indicating or implying relative importance or to implicitly indicate the number of technical features indicated. Thus, a feature defined as "first" or "second" may explicitly or implicitly include at least one of the feature. In addition, technical solutions between the embodiments can be combined with each other, but must be based on the realization of the technical solutions by those skilled in the art, and when the technical solutions are contradictory to each other or cannot be realized, the technical solutions should be considered that the combination does not exist, and the technical solutions are not fallen within the protection scope claimed in the present disclosure.

Figure 2:
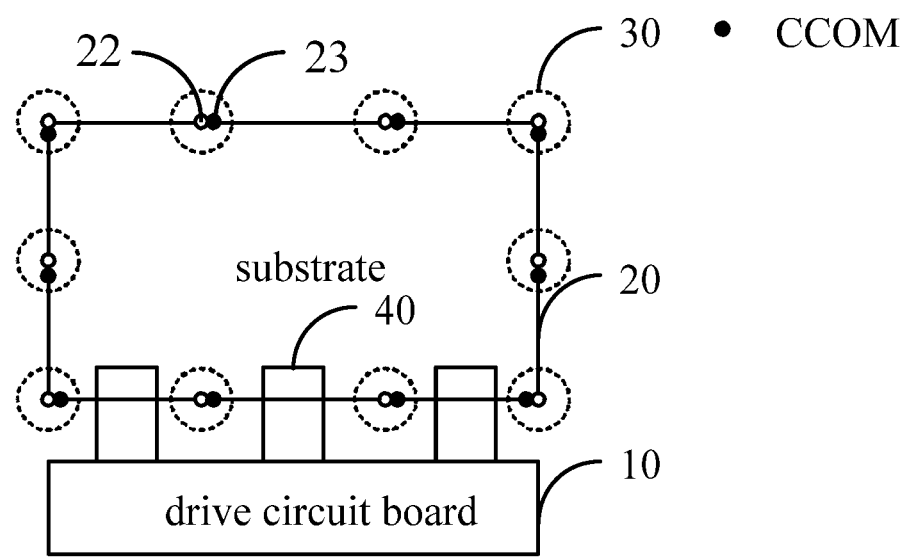
FIG. 2 is a schematic structural diagram of a display panel driven in a Twisted Nematic (TN)/Vertical Alignment (VA) mode of the present disclosure.

As shown in FIG. 1 and FIG. 2, FIG. 1 is a schematic structural diagram of a display panel driven in a FFS/IPS mode of the present disclosure, and FIG. 2 is a schematic structural diagram of a display panel driven in a TN/VA mode of the present disclosure.

In this embodiment, the display panel includes a drive circuit board 10 and a substrate 20, the drive circuit board 10 is connected with the substrate 20 through a chip on film (COF) 40. The drive circuit board 10 can include a grid drive circuit board, a source drive circuit board and a compensation unit 11. The substrate 20 is provided with a pixel array 21, and each pixel in the pixel array 21 include a liquid crystal unit, and two poles of an applied electric filed of liquid crystal unit are a pixel electrode and a common electrode respectively. The pixel electrode is connected to a scan line and a data line through a thin film transistor (TFT). The common electrodes corresponding to each liquid crystal unit are connected with each other and form a common electrode wire 30. The drive circuit board 10 can be connected with the substrate 20 through the COF, the grid drive circuit board is connected with each scan line to drive the TFT corresponding to each row of pixel to be turned on or off, and the source drive circuit board is connected with the data line to input data voltage to each pixel, the compensation unit 11 is connected with the common electrode wire 30 for the inverse compensation. A drive architecture of the display panel is different, and a distribution of the common electrode wire 30 is also different. FIG. 1 shows a distribution of the common electrode wire 30 when the display panel is driven in the FFS or IPS display mode. For this kind of display panel, the common electrode wires 30 are all distributed on the array substrate 22 (which is generally called ACOM, a hollow circle as shown in FIG. 1). FIG. 2 shows a distribution of the common electrode wire 30 when the display panel is driven in the TN or VA display mode. For this kind of display panel, the common electrode wire 30 is distributed on the array substrate 22 and the color film substrate 23 (the common electrode wire 30 on the array substrate 22 is generally called ACOM, a hollow circle as shown in FIG. 2; the common electrode wire 30 on the color film substrate 23 is generally called CCOM, a solid circle as shown in FIG. 2). The common electrode wires 30 shown in FIG. 1 and FIG. 2 are only examples, a specific distribution can be provided according to the need.

Figure 3:
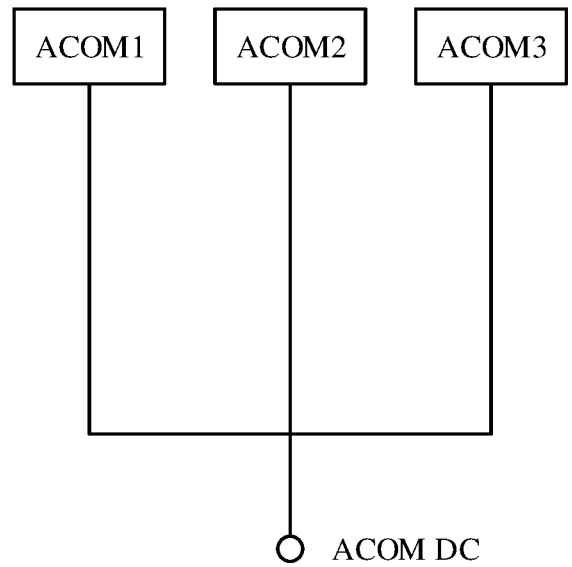
FIG. 3 is a schematic connection diagram of a common electrode without an inverse compensation in the FFS/IPS mode of the present disclosure.
Figure 4:
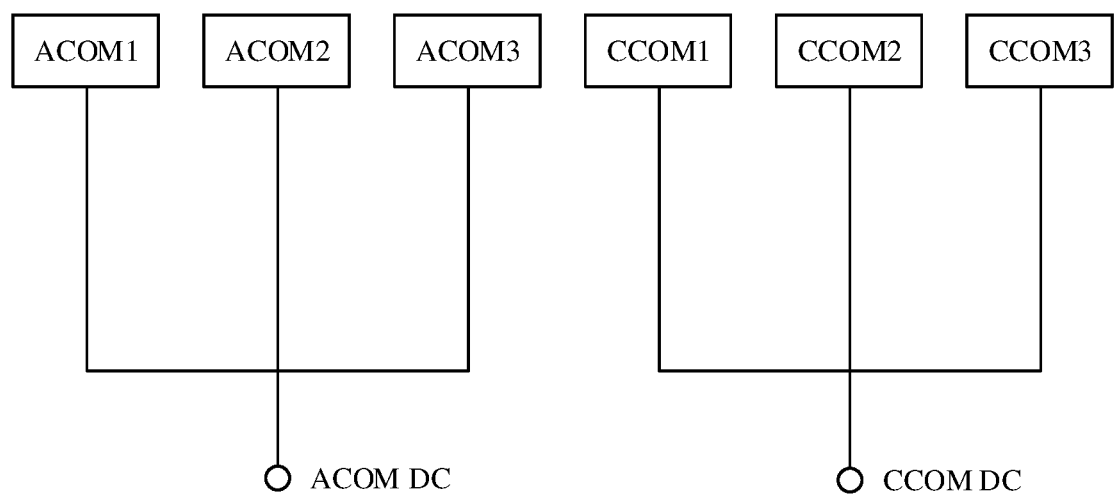
FIG. 4 is a schematic connection diagram of a common electrode without an inverse compensation in the TN/VA mode of the present disclosure.

As shown in FIG. 3 and FIG. 4, FIG. 3 is a schematic connection diagram of a common electrode without an inverse compensation in the FFS/IPS mode of the present disclosure, and FIG. 4 is a schematic connection diagram of a common electrode without an inverse compensation in the TN/VA mode of the present disclosure. As shown in FIG. 3 and FIG. 4, all the ACOM wires are connected to the ACOM DC when the common electrode wire is provided without an inverse compensation, and the ACOM DC is an actual voltage applied on each common electrode wire 30. All the CCOM wires are connected to the CCOM DC, and the CCOM DC is an actual voltage applied on each common electrode wire 30.

Figure 5:
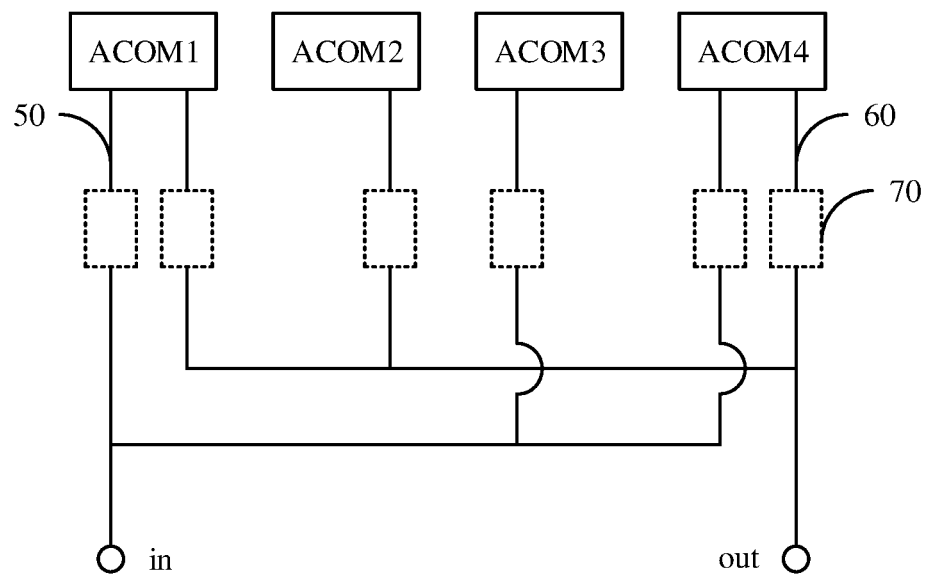
FIG. 5 is a schematic diagram of a first connection method of the common electrode in the FFS/IPS mode of the present disclosure.

As shown in FIG. 5, FIG. 5 is a schematic diagram of a first connection method of the common electrode in the FFS/IPS mode of the present disclosure.

It should be noted that, when the compensation unit is performing the inverse compensation to the common electrode, the voltage of the common electrode needs to be detected and then a voltage is fed back to the common electrode. Thus, the compensation unit includes a detection terminal in for accessing to a voltage of the common electrode wire and a feedback terminal out for feeding back a compensation voltage to the common electrode wire.

In this embodiment, at least one common electrode wire 30 is provided with a first connecting wire 50 and at least one common electrode wire 30 is provided with a second connecting wire 60, the first connecting wire 50 is connected with the detection terminal in, the second connecting wire 60 is connected with the feedback terminal out, both the first connecting wire 50 and the second connecting wire 60 are provided with a configuration section 70. When the configuration section 70 is provided with the connector, the connecting wire corresponding to the configuration section 70 is on an on-state. When the configuration section 70 is provided without the connector, the connecting wire corresponding to the configuration section 70 is on an off-state.

It should be noted that, the ACOM1, ACOM2, ACOM3 and ACOM4 in FIG. 5 represent different common electrode wires 30. The display panel can be provided with more common electrode wires 30, such as 8 or 16 common electrode wires 30. The configuration section 70 of the connecting wire does not exist conducting wire, therefore, the connecting wire on the configuration section 70 is equivalent to be in an off-state. The connecting wires at both ends can be connected by providing a connector on the configuration section 70, so that the common electrode wire 30 forms a circuit with the detection terminal in or the feedback terminal out.

In this embodiment, the debugging personnel can set the configuration section 70 on each connecting wire to adjust the position and quantity of the detection point and the position and quantity of the feedback point when debugging the inverse compensation of the common electrode. Since a circuit is pre-formed between the common electrode wire 30 and the detection terminal in and the feedback terminal out, the debugging personnel can adjust the inverse compensation method flexibly. When the chosen compensation method fails to achieve the expected compensation effect, each configuration section 70 can be adjusted to change the wire to avoid rewiring.

It should be noted that, the connector can be a switch tube in an on-state. The configuration section 70 can be pre-configured with the switch tube. The switch tube can be switched from on-state and off-state under control of the drive circuit board 10. When debugging the inverse compensation of the common electrode, the debugging personnel can directly adjust the state of each switch tube to adjust the position and quantity of the detection point and the position and quantity of the feedback point. Meanwhile, when used for displaying, the display panel can further switch the inverse compensation of the common electrode under the control of the drive circuit board 10 to improve the display effect.

Figure 6:
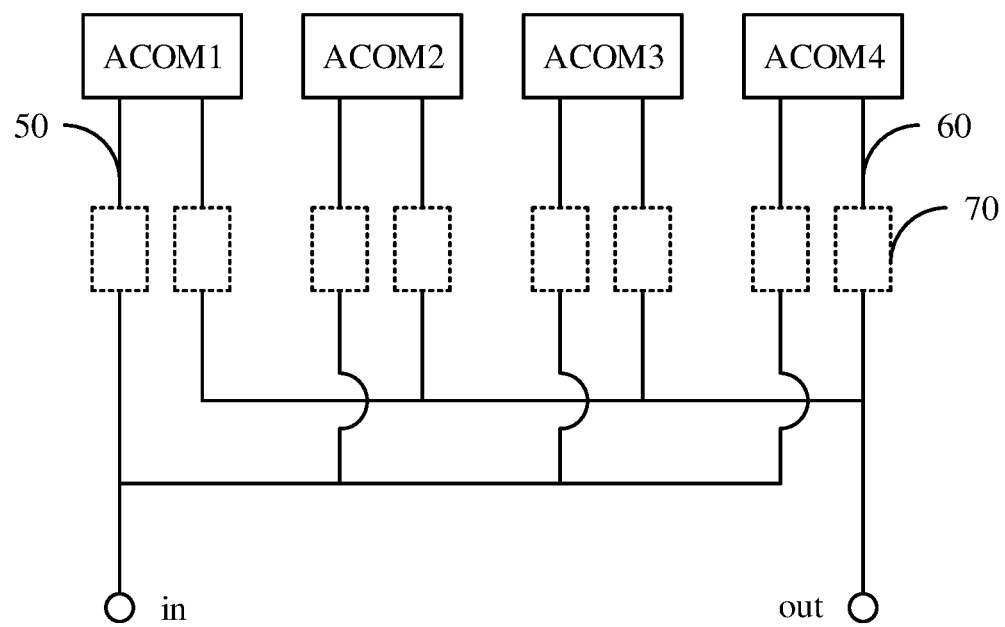
FIG. 6 is a schematic diagram of a second connection method of the common electrode in the FFS/IPS mode of the present disclosure.

As shown in FIG. 6, FIG. 6 is a schematic diagram of a second connection method of the common electrode in the FFS/IPS mode of the present disclosure. To improve the selectivity of the wire, in this embodiment, each common electrode wire 30 is provided with the first connecting wire 50 and the second connecting wire 60. Therefore, the debugging personnel can connect any one of the common electrode wires 30 to the detection terminal in or the feedback terminal out.

Figure 7:
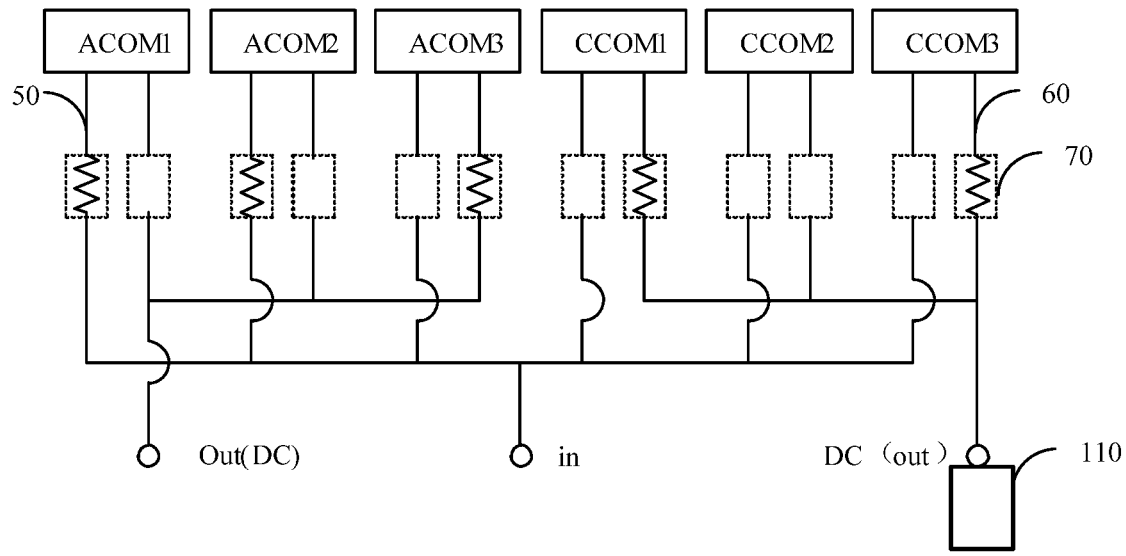
FIG. 7 is a schematic diagram of a first connection method of the common electrode in the TN/VA mode of the present disclosure.

As shown in FIG. 7, FIG. 7 is a schematic diagram of a first connection method of the common electrode in the TN/VA mode of the present disclosure. To improve the selectivity of the inverse compensation method of the common electrode in the TN/VA display mode, this embodiment provides a respective wiring to the array substrate and the color film substrate.

As shown in FIG. 7, a plurality of the common electrode wires include the plurality of first common electrode wires ACOM and the plurality of the second common electrode wires CCOM, the first common electrode wire ACOM is provided on the array substrate of the display panel, the second common electrode wire CCOM is provided on the color film substrate of the display panel, at least one first common electrode wire ACOM is provided with the second connecting wire, and at least one second common electrode wire CCOM is provided with the second connecting wire.

It should be noted that, ACOM1, ACOM2 and ACOM3 represent the different first common electrode wires ACOM, CCOM1, CCOM2 and CCOM3 represent the different second common electrode wires CCOM. The display panel can be provided with more first common electrode wires ACOM and more second common electrode wires CCOM, such as 8 or 16.

In an embodiment, in order to feed back the common electrode on different substrate, the display panel further includes a power supply unit 110, the power supply unit 110 is provided with a power supply terminal DC, and the power supply unit 110 supplies a fixed voltage to the power supply terminal DC. The second connecting wire 60 corresponding to the first common electrode wire ACOM is connected with the power supply terminal DC, and the second connecting wire 60 corresponding to the second common electrode wire CCOM is connected with the feedback terminal out. The second connecting wire 60 corresponding to the first common electrode wire ACOM is connected with the feedback terminal out, and the second connecting wire 60 corresponding to the second common electrode wire CCOM is connected with the power supply terminal DC. The power supply terminal DC is not engaged in feedback compensation, that is, when the voltage of the feedback terminal out changes, the voltage of the power supply terminal DC remains constant.

Figure 8:
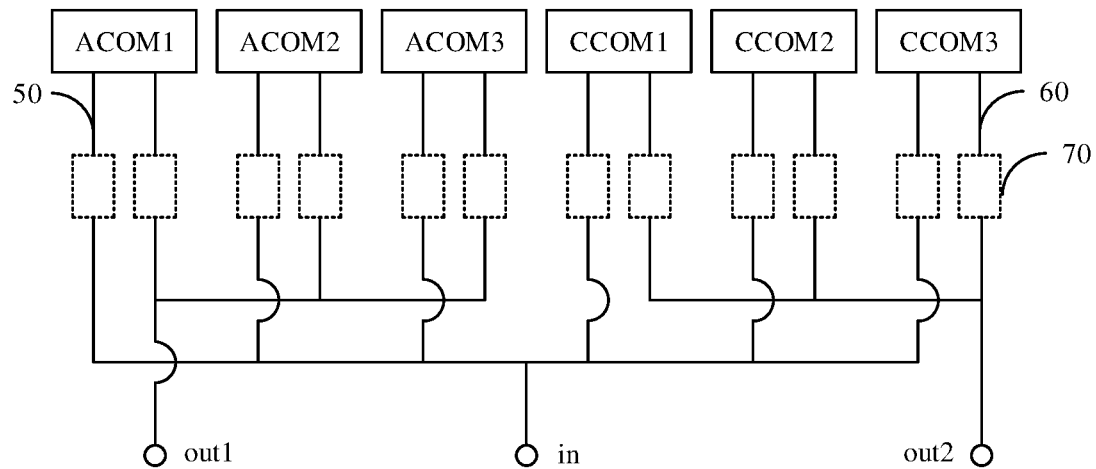
FIG. 8 is a schematic diagram of a second connection method of the common electrode in the TN/VA mode of the present disclosure.

As shown in FIG. 8, FIG. 8 is a schematic diagram of a second connection method of the common electrode in the TN/VA mode of the present disclosure. Or, the first common electrode wire ACOM on the array substrate and the second common electrode wire CCOM on the color film substrate can be further applied with the feedback compensation. The feedback terminal out includes a first feedback terminal out1 and a second feedback terminal out2, the second connecting wire corresponding to the first common electrode wire ACOM is connected with the first feedback terminal out1, and the second connecting wire corresponding to the second common electrode wire CCOM is connected with the second feedback terminal out2.

It is understandable that, also, to improve the selectivity of the wiring, in this embodiment, each first common electrode wire ACOM and each second common electrode wire CCOM are provided with a first connecting wire 50 and a second connecting wire 60. Therefore, the debugging personnel can connect any one of the first common electrode wire ACOM and any one of the second common electrode wire CCOM to the detection terminal in or the feedback terminal out.

In an embodiment, at least one common electrode wire 30 is provided with the first connecting wire 50 connected with the detection terminal in and at least one common electrode wire 30 is provided with the second connecting wire 60 connected with the feedback terminal out, both the first connecting wire 50 and the second connecting wire 60 are provided with the configuration section 70. When the configuration section is provided with the connector, the connecting wire corresponding to the configuration section 70 is in the on-state. When the configuration section 70 is provided without the connector, the configuration section 70 is in the off-state. In the present disclosure, when debugging an inverse compensation of the common electrode, the debugging personnel may configure the configuration sections 70 on each connecting wire, and adjust the position and quantity of the detection point and the position and quantity of the feedback point. Thus, when the debugging personnel readjusts a wiring, a rewiring is not needed, which improves the debugging efficiency and reduces the cost.

Figure 9:
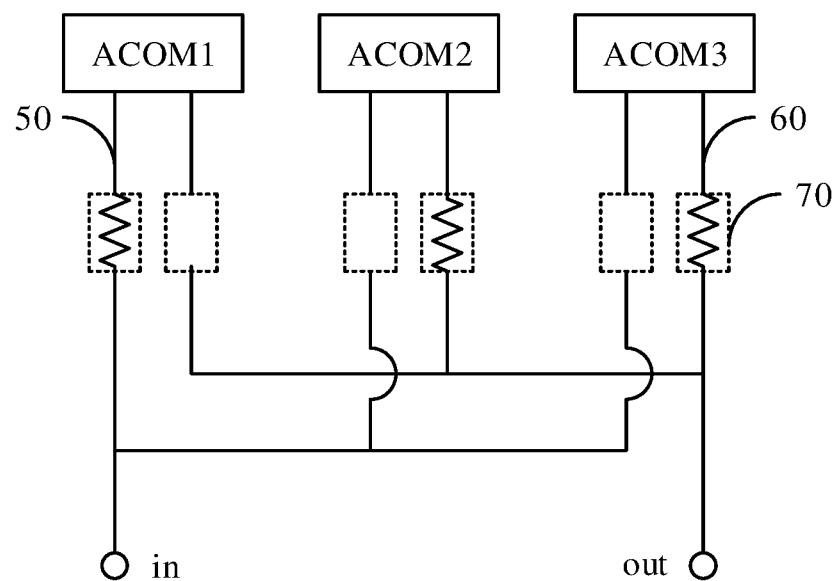
FIG. 9 is a schematic diagram of a first connection method of the common electrode with the inverse compensation in the FFS/IPS mode of the present disclosure.

As shown in FIG. 9, FIG. 9 is a schematic diagram of a first connection method of the common electrode with the inverse compensation in the FFS/IPS mode of the present disclosure.

In this embodiment, a method for providing the inverse compensation of the common electrode to the display panel is further illustrated. To achieve an inverse compensation of the compensation unit, that is, the compensation unit can detect the voltage of the common electrode and also feed back a compensation voltage to the common electrode, the configuration section 70 of at least one first connecting wire 50 is provided with the connector, the configuration section 70 of at least one second connecting wire 60 is provided with the connector.

It should be noted that, the common electrode wire 30 generally can only be a detection point or a feedback point. When the common electrode wire 30 is provided with the first connecting wire 50 and the second connecting wire 60, at most one connecting wire is in the on-state. The calculation method of the executive feedback voltage performed by the compensation unit has mature solutions, and the method will not be described here again.

As shown in FIG. 9, the configuration section 70 of the first connecting wire 50 corresponding to the ACOM1 is provided with the connector, the configuration section 70 of the second connecting wire 60 corresponding to the ACOM2 and the ACOM3 is provided with the connector. The compensation unit can obtain the voltage of the common electrode through the ACOM1, and feed back the compensation voltage to the common electrode through the ACOM2 and the ACOM3.

Figure 10:
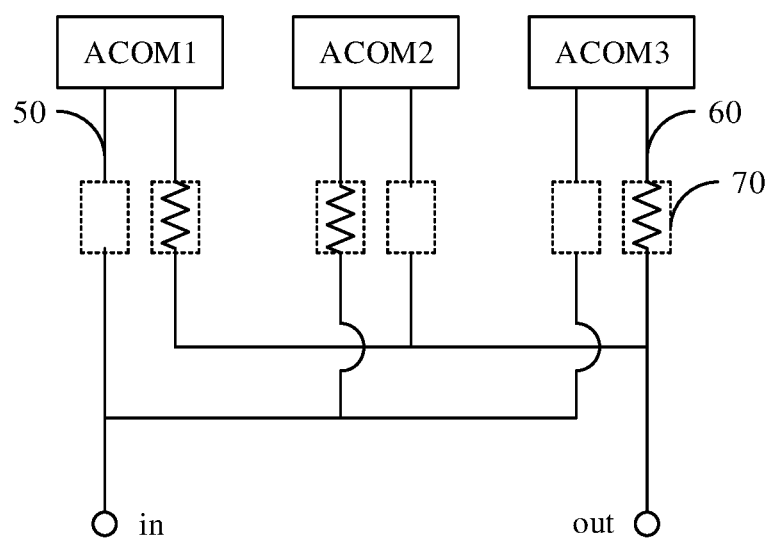
FIG. 10 is a schematic diagram of a second connection method of the common electrode with the inverse compensation in the FFS/IPS mode of the present disclosure.

As shown in FIG. 10, FIG. 10 is a schematic diagram of a second connection method of the common electrode with the inverse compensation in the FFS/IPS mode of the present disclosure. As shown in FIG. 10, the configuration section 70 of the first connecting wire 50 corresponding to the ACOM2 is provided with the connector, the configuration section 70 of the second connecting wire 60 corresponding to the ACOM1 and the ACOM3 is provided with the connector. The compensation unit can obtain the voltage of the common electrode through the ACOM2, and feed back the compensation voltage to the common electrode through the ACOM1 and the ACOM3.

Figure 11:
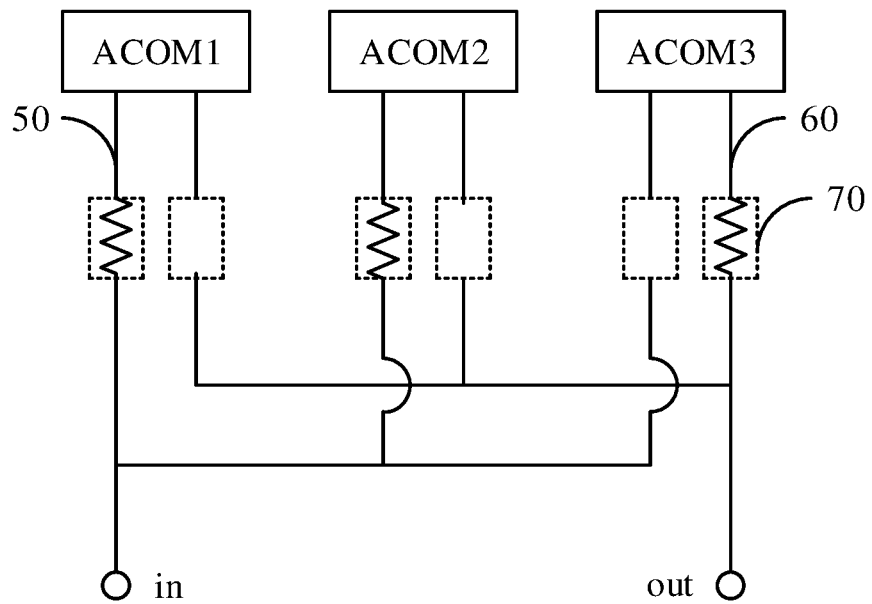
FIG. 11 is a schematic diagram of a third connection method of the common electrode with the inverse compensation in the FFS/IPS mode of the present disclosure.

As shown in FIG. 11, FIG. 11 is a schematic diagram of a third connection method of the common electrode with the inverse compensation in the FFS/IPS mode of the present disclosure. As shown in FIG. 11, the configuration section 70 of the first connecting wire 50 corresponding to the ACOM1 and the ACOM2 is provided with the connector, the configuration section 70 of the second connecting wire 60 corresponding to the ACOM3 is provided with the connector. The compensation unit can obtain the voltage of the common electrode through the ACOM1 and the ACOM2, and feed back the compensation voltage to the common electrode through the ACOM3.

Figure 12:
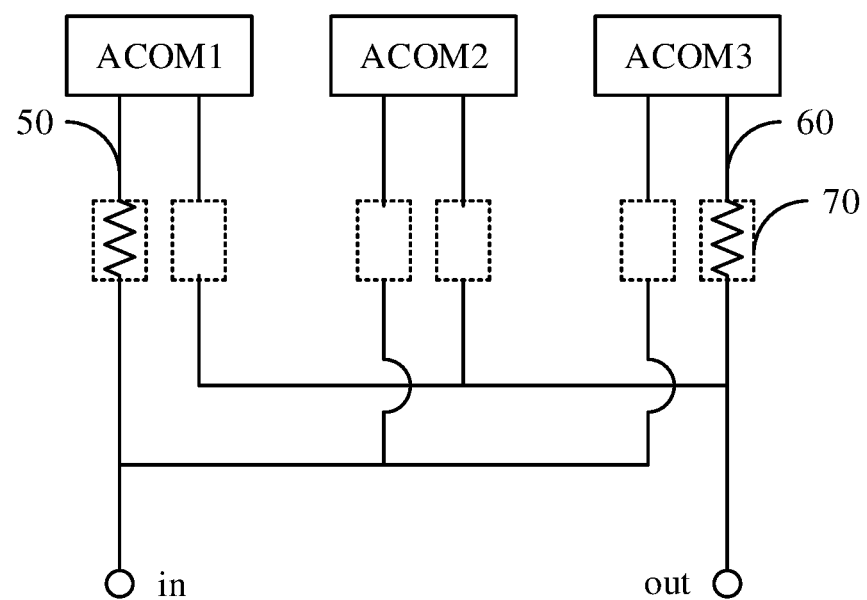
FIG. 12 is a schematic diagram of a fourth connection method of the common electrode with the inverse compensation in the FFS/IPS mode of the present disclosure.

As shown in FIG. 12, FIG. 12 is a schematic diagram of a fourth connection method of the common electrode with the inverse compensation in the FFS/IPS mode of the present disclosure. As shown in FIG. 12, the configuration section 70 of the first connecting 50 corresponding to the ACOM1 is provided with the connector, the configuration section 70 of the second connecting wire 60 corresponding to the ACOM3 is provided with the connector. The compensation unit can obtain the voltage of the common electrode through the ACOM1, and feed back the compensation voltage to the common electrode through the ACOM3.

In the specific embodiment, the connector is a resistor. The resistor is connected with the connecting wires at both ends of the configuration section 70, the connecting wire between the common electrode wire 30 and the detection terminal in or the feedback terminal out is in the on-state. The connector can further be other elements, which is not limited in this embodiment.

Figure 13:
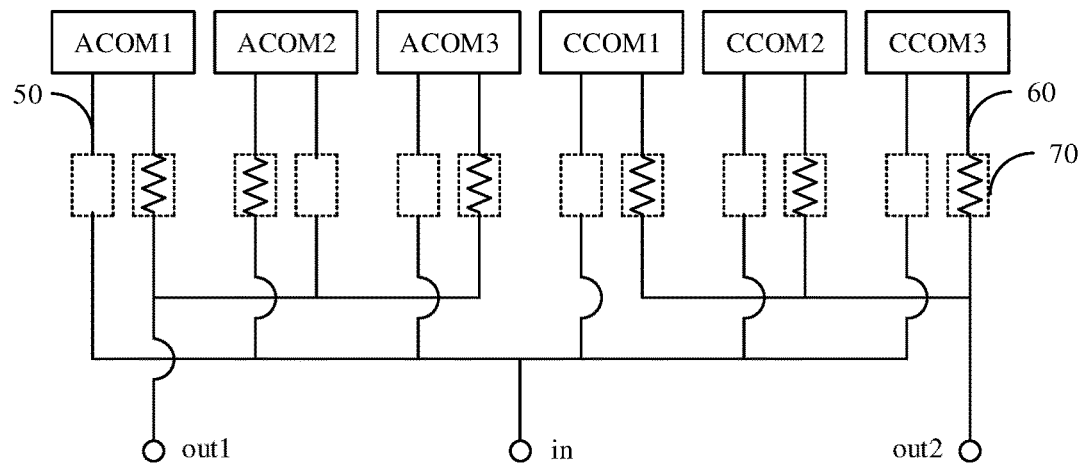
FIG. 13 is a schematic diagram of a first connection method of the common electrode with the inverse compensation in the TN/VA mode of the present disclosure.

As shown in FIG. 13, FIG. 13 is a schematic diagram of a first connection method of the common electrode with the inverse compensation in the TN/VA mode of the present disclosure. The embodiment further provides a method for providing the inverse compensation of the common electrode in the TN/VA display mode. A plurality of the common electrode wire include a plurality of the first common electrode wire ACOM and a plurality of the second common electrode wire CCOM, the first common electrode wire ACOM is provided on the array substrate of the display panel, and the second common electrode wire CCOM is provided on the color film substrate of the display panel, at least one first common electrode wire ACOM is provided with the second connecting wire 60 in the on-state, and at least one second common electrode wire CCOM is provided with the second connecting wire 60 in the on-state.

It is understandable that, due to the possible difference between the common electrode on the array substrate and the common electrode on the color film substrate, there is a need for providing the feedback circuit for the first common electrode wire ACOM and the second common electrode wire CCOM respectively.

As shown in FIG. 13, the configuration section 70 of the first connecting wire 50 corresponding to the ACOM2 is provided with the connector, and the configuration sections 70 of the second connecting wire 60 corresponding to the ACOM1, the ACOM3, the CCOM1 and the CCOM3 are provided with the connector. The compensation unit can obtain the voltage of the common electrode on the array substrate through the ACOM2, and feed back the compensation voltage to the common electrode on the array substrate and the color film substrate through the ACOM1, the ACOM3, the CCOM1 and the CCOM3.

In this embodiment, in order to improve the inverse compensation effect, the at least one first common electrode wire ACOM can further be provided with the first connecting wire 50 in the on-state, and the at least one second common electrode wire can further be provided with the first connecting wire 50 in the on-state.

It is understandable that, the compensation unit can detect the real time voltage of the common electrode on the array substrate and the real time voltage of the common electrode on the color film substrate, thereby providing a more accurate compensation voltage for the common electrode on the array substrate and the common electrode on the color film substrate.

Figure 14:
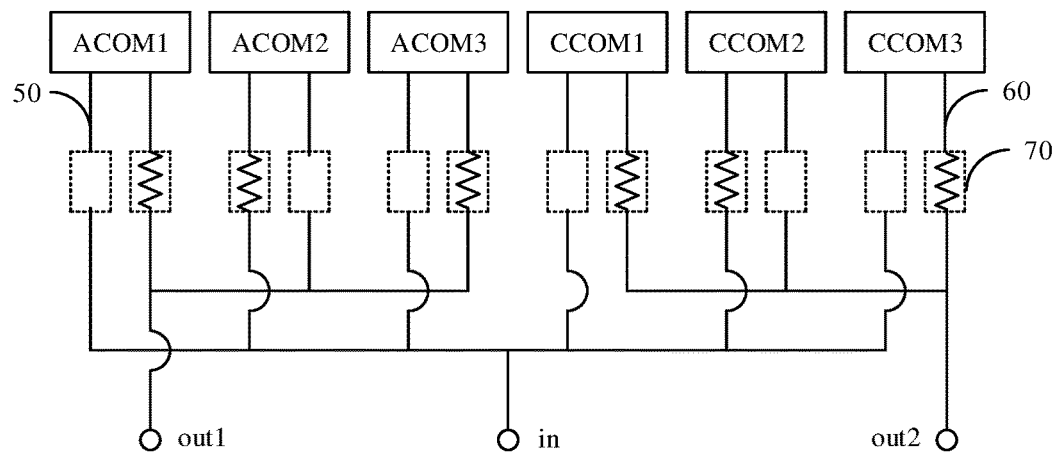
FIG. 14 is a schematic diagram of a second connection method of the common electrode with the inverse compensation in the TN/VA mode of the present disclosure.

As shown in FIG. 14, FIG. 14 is a schematic diagram of a second connection method of the common electrode with the inverse compensation in the TN/VA mode of the present disclosure. The configuration section 70 of the first connecting wire 50 corresponding to the ACOM2 and the CCOM2 is provided with the connector, the configuration sections 70 of the second connecting wire 60 corresponding to the ACOM1, the ACOM3, the CCOM1 and the CCOM3 is provided with the connector. The compensation unit can obtain the voltage of the common electrode on the array substrate and the color film substrate through the ACOM2 and the CCOM2, and feed back the compensation voltage to the common electrode on the array substrate and the color film substrate through the ACOM1, the ACOM3, the CCOM1 and the CCOM3.

Figure 15:
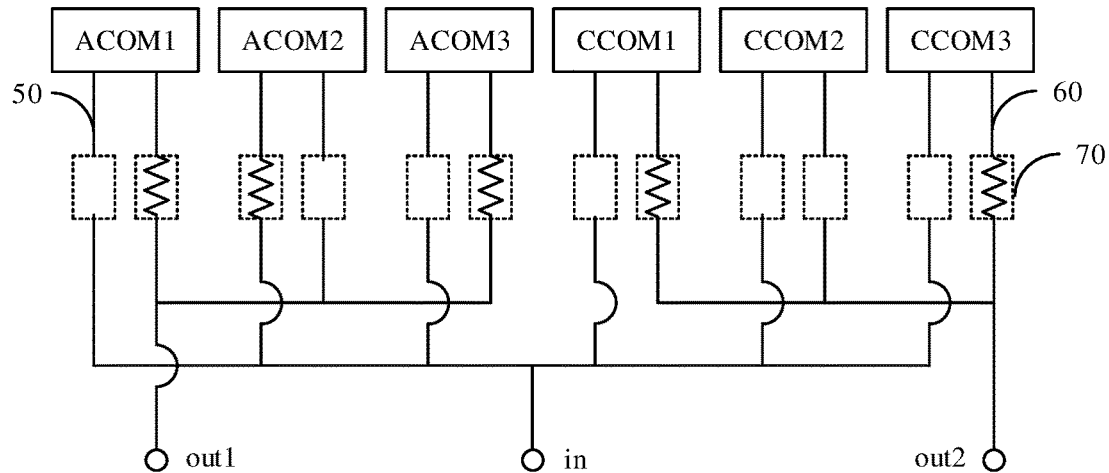
FIG. 15 is a schematic diagram of a third connection method of the common electrode with the inverse compensation in the TN/VA mode of the present disclosure.

As shown in FIG. 15, FIG. 15 is a schematic diagram of a third connection method of the common electrode with the inverse compensation in the TN/VA mode of the present disclosure. The configuration section 70 of the first connecting wire 50 corresponding to the ACOM2 is provided with the connector, the configuration sections 70 of the second connecting wire 60 corresponding to the ACOM1, the ACOM3, the CCOM1 and the CCOM3 are provided with the connector, the configuration sections 70 of the first connecting wire 50 and the second connecting wire 60 corresponding to the CCOM2 are provided without a connector. The compensation unit can obtain the voltage of the common electrode on the array substrate and the color film substrate through the ACOM2, and feed back the compensation voltage to the common electrode on the array substrate and the color film substrate through the ACOM1, the ACOM3, the CCOM1 and the CCOM3.

Figure 16:
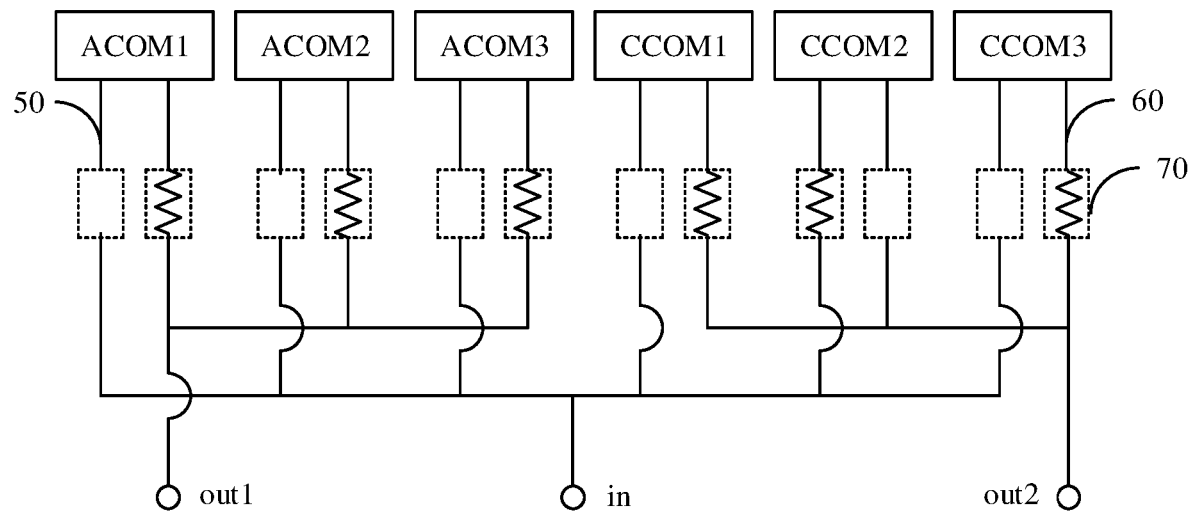
FIG. 16 is a schematic diagram of a fourth connection method of the common electrode with the inverse compensation in the TN/VA mode of the present disclosure.

As shown in FIG. 16, FIG. 16 is a schematic diagram of a fourth connection method of the common electrode with the inverse compensation in the TN/VA mode of the present disclosure. The configuration section 70 of the first connecting wire 50 corresponding to the CCOM2 is provided with the connector, the configuration sections 70 of the second connecting wire 60 corresponding to the ACOM1, the ACOM2, the ACOM3, the CCOM1 and the CCOM3 is provided with the connector. The compensation unit can obtain the voltage of the common electrode on the array substrate and the color film substrate through the CCOM2, and feed back the compensation voltage to the common electrode on the array substrate and the color film substrate through the ACOM1, the ACOM2, the ACOM3, the CCOM1 and the CCOM3.

In this embodiment, each common electrode wire 30 can further be provided with a connecting wire in the on-state. That is, each common electrode wire 30 is provided with the first connecting wire 50 in the on-state or the second connecting wire 60 in the on-state. By taking full advantage of each common electrode wire 30 of the display panel, the inverse compensation of the common electrode is improved, and thus the display effect of the display panel is improved.

In this embodiment, the configuration section 70 of the at least one first connecting wire 50 is provided with the connector, and the configuration section 70 of the at least one second connecting wire 60 is provided with the connector. The embodiment betters stabilizing the voltage of the common electrode of the display panel thus improve the display effect by providing the inverse compensation of the common electrode of the preset wire and detecting the voltage of the common electrode.

Figure 17:
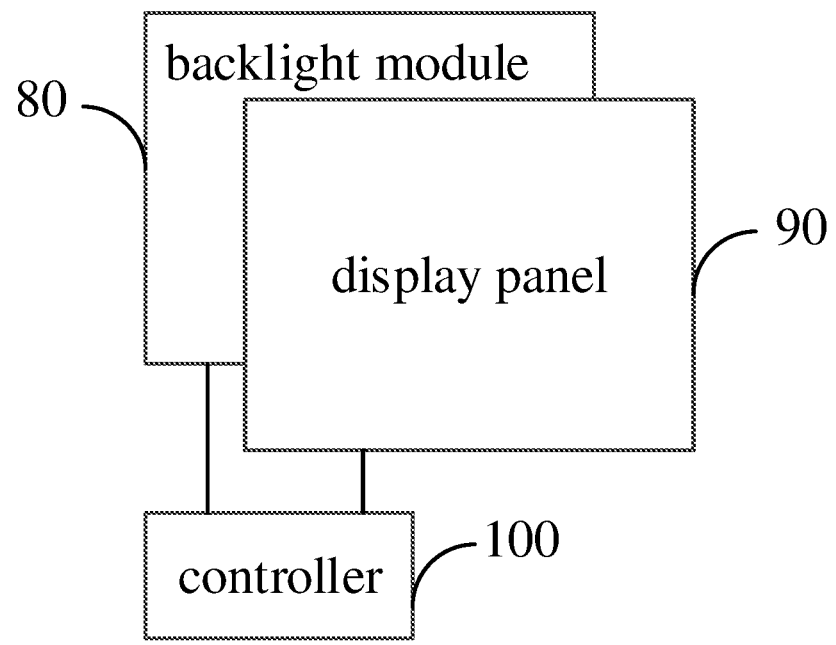
FIG. 17 is a structural block diagram of the display according to an embodiment of the present disclosure.

As shown in FIG. 17, FIG. 17 is a schematic structural block diagram of the display according to an embodiment of the present disclosure. To achieve the above objective, the present disclosure further provides a display, the display includes a backlight module 80, the above display panel 90 and a controller 100, the backlight module 80 is provided on a back of the display panel 90, and the backlight module 80 is used for supplying a backlight for the display panel 90, the controller 100 is connected to the backlight module 80 and the display panel 90, and the controller 100 is configured to control the backlight module 80 and the display panel 90 on a basis of an input image data to display the corresponding image. A specific structure of the display panel 90 refers to the above embodiments, since the display can be applied with the technical solutions of all the above embodiments, the display possesses at least the beneficial effects brought by the technical solutions of the above embodiments, and will not be repeated here.

The above are only some embodiments of the present disclosure, and do not limit the scope of the present disclosure thereto. Under the inventive concept of the present disclosure, equivalent structural transformations made according to the description and drawings of the present disclosure, or direct/indirect application in other related technical fields are included in the scope of the present disclosure.

What is claimed is:

1. A display panel, comprising:
    a pixel array connected with a plurality of common electrode wires; and
    a compensation unit, comprising:
        a detection terminal for accessing a voltage of the common electrode wire; and
        a feedback terminal for feeding back a compensation voltage to the common electrode wire; and
    wherein at least one common electrode wire is provided with a first connecting wire and a second connecting wire, the first connecting wire is connected with the detection terminal, the second connecting wire is connected with the feedback terminal, both the first connecting wire and the second connecting wire are provided with a configuration section; and
    wherein when the configuration section is provided with an on-state connector, a connecting wire corresponding to the configuration section is in an on-state; or when the configuration section is provided without the on-state connector, a connecting wire corresponding to the configuration section is in an off-state;
    the plurality of common electrode wires comprise a plurality of first common electrode wires and a plurality of second common electrode wires, and
    the first common electrode wire is provided on an array substrate of the display panel, the second common electrode wire is provided on a color filter substrate of the display panel, at least one first common electrode wire is provided with the second connecting wire, and at least one second common electrode wire is provided with the second connecting wire.

2. The display panel of claim 1, wherein the display panel further comprises a drive circuit board and a substrate, the drive circuit board is connected with the substrate through a chip on film (COF), and the pixel array is provided on the substrate.

3. The display panel of claim 1, wherein each common electrode wire is provided with the first connecting wire and the second connecting wire.

4. The display panel of claim 1, further comprising:
    a power supply unit,
    wherein the power supply unit is provided with a power supply terminal, and the power supply unit supplies a fixed voltage to the power supply terminal;
    wherein the second connecting wire corresponding to the first common electrode wire is connected with the power supply terminal, the second connecting wire corresponding to the second common electrode wire is connected with the feedback terminal; or
    wherein the second connecting wire corresponding to the first common electrode wire is connected with the feedback terminal, the second connecting wire corresponding to the second common electrode wire is connected with the power supply terminal.

5. The display panel of claim 1, wherein the compensation unit is for feeding back a compensation voltage to the common electrode through acquiring a voltage of the common electrode.

6. The display panel of claim 1, wherein the feedback terminal comprises a first feedback terminal and a second feedback terminal, the second connecting wire corresponding to the first common electrode wire is connected with the first feedback terminal, and the second connecting wire corresponding to the second common electrode wire is connected with the second feedback terminal.

7. The display panel of claim 1, wherein a configuration section of at least one first connecting wire is provided with the on-state connector, and a configuration section of at least one second connecting wire is provided with the on-state connector.

8. The display panel of claim 7, wherein the on-state connector is a switch tube, and the switch tube is switched from the on-state and the off-state under control of the drive circuit board.

9. The display panel of claim 7, wherein:
    the plurality of common electrode wires comprise a plurality of first common electrode wires and a plurality of second common electrode wires,
    the first common electrode wire is provided on the array substrate of the display panel, the second common electrode wire is provided on the color filter substrate of the display panel.

10. The display panel of claim 7, wherein at least one first common electrode wire is provided with a second connecting wire in an on-state, and at least one second common electrode wire is provided with a second connecting wire in an on-state.

11. The display panel of claim 9, wherein at least one first common electrode wire is provided with a first connecting wire in an on-state, and at least one second common electrode wire is provided with a first connecting wire in an on-state.

12. The display panel of claim 7, wherein each common electrode wire is provided with a connecting wire in an on-state.

13. A display, comprising:
    a backlight module; and
    a display panel, comprising:
        a pixel array connected with a plurality of common electrode wires; and
        a compensation unit, comprising:
            a detection terminal for accessing a voltage of the common electrode wire; and
            a feedback terminal for feeding back a compensation voltage to the common electrode wire; and
        wherein at least one common electrode wire is provided with a first connecting wire and a second connecting wire, the first connecting wire is connected with the detection terminal, the second connecting wire is connected with the feedback terminal, both the first connecting wire and the second connecting wire are provided with a configuration section; and
        wherein when the configuration section is provided with an on-state connector, a connecting wire corresponding to the configuration section is in an on-state; or when the configuration section is provided without the on-state connector, a connecting wire corresponding to the configuration section is in an off-state, and the plurality of common electrode wires comprise a plurality of first common electrode wires and a plurality of second common electrode wires, and the first common electrode wire is provided on an array substrate of the display panel, the second common electrode wire is provided on a color filter substrate of the display panel, at least one first common electrode wire is provided with the second connecting wire, and at least one second common electrode wire is provided with the second connecting wire;

wherein the backlight module is provided on a back of the display panel, and the backlight module is for supplying a backlight for the display panel.

14. The display of claim 13, further comprising:

a controller, wherein the controller is connected with the backlight module and the display panel, and the controller is for controlling the backlight module and the display panel on a basis of an input image data to display a corresponding image.

* * * * *